United States Patent
Wang et al.

(10) Patent No.: US 9,222,971 B2
(45) Date of Patent: Dec. 29, 2015

(54) FUNCTIONAL PATH FAILURE MONITOR

(71) Applicants: Xiaoxiao Wang, Austin, TX (US); Orman G. Shofner, Cedar Park, TX (US); Dat T. Tran, Round Rock, TX (US); Leroy Winemberg, Austin, TX (US); Ender Yilmaz, Austin, TX (US)

(72) Inventors: Xiaoxiao Wang, Austin, TX (US); Orman G. Shofner, Cedar Park, TX (US); Dat T. Tran, Round Rock, TX (US); Leroy Winemberg, Austin, TX (US); Ender Yilmaz, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/067,886

(22) Filed: Oct. 30, 2013

(65) Prior Publication Data

US 2015/0121158 A1    Apr. 30, 2015

(51) Int. Cl.
*G01R 31/3177* (2006.01)
*G01R 31/3185* (2006.01)
*G01R 31/317* (2006.01)
*G01R 31/28* (2006.01)

(52) U.S. Cl.
CPC .. *G01R 31/31703* (2013.01); *G01R 31/318563* (2013.01); *G01R 31/318566* (2013.01); *G01R 31/2856* (2013.01)

(58) Field of Classification Search
CPC .............. G01R 31/3187; G01R 31/31813; G01R 31/318547; G01R 31/31703; G01R 31/31725; G01R 31/3177; G01R 31/318563; G01R 31/318566; G01R 31/2856; G01R 31/2882
USPC ......... 714/732, 700, 726, 731, 733, 738, 724, 714/736
See application file for complete search history.

(56) References Cited

U.S. PATENT DOCUMENTS

| | | | | |
|---|---|---|---|---|
| 5,606,567 A * | 2/1997 | Agrawal et al. | ............... | 714/732 |
| 5,925,144 A * | 7/1999 | Sebaa | ............ | 714/733 |
| 6,247,154 B1 * | 6/2001 | Bushnell et al. | ............. | 714/733 |
| 6,684,358 B1 * | 1/2004 | Rajski et al. | .................. | 714/739 |
| 6,901,546 B2 * | 5/2005 | Chu et al. | ...................... | 714/738 |
| 7,080,288 B2 * | 7/2006 | Ferraiolo et al. | ................ | 714/43 |
| 7,130,230 B2 * | 10/2006 | Jain et al. | ...................... | 365/201 |
| 7,131,046 B2 * | 10/2006 | Volkerink et al. | ............. | 714/732 |
| 7,398,443 B2 * | 7/2008 | Mushirabad et al. | ......... | 714/733 |
| 7,398,444 B2 * | 7/2008 | Brox | ................ | G01R 31/31716 714/736 |
| 7,437,641 B1 * | 10/2008 | Gorshe | ......................... | 714/732 |
| 7,461,304 B1 * | 12/2008 | Rosen | .......................... | 714/700 |
| 7,487,420 B2 * | 2/2009 | Keller | ............................ | 714/732 |

(Continued)

OTHER PUBLICATIONS

Arabi, K., et al., "Dynamic Digital Integrated Circuit Testing Using Oscillation-Test Method", Electronics Letters, vol. 34, Issue 8, Apr. 16, 1998, pp. 762-764.

(Continued)

*Primary Examiner* — James C Kerveros

(57) ABSTRACT

System circuitry includes a logic circuit having an input and an output that is a functional element of the system circuitry. Pattern application circuitry is coupled to the input of the logic circuit and provides an input pattern to the input of the logic circuit. The input pattern has a valid signature based upon a comparison of the input and the output of the logic circuit when the logic circuit is functioning properly. A logic comparator is coupled to the input and the output of the logic circuit and generates pulses in response to the input pattern. A counter is coupled to the logic comparator that obtains a count of the pulses generated by the logic comparator in response to the input pattern. A signature comparator is coupled to the counter and generates a warning signal if the valid signature is different from the count.

20 Claims, 3 Drawing Sheets

(56) References Cited

U.S. PATENT DOCUMENTS

| | | | |
|---|---|---|---|
| 7,509,551 B2* | 3/2009 | Koenemann et al. | 714/732 |
| 7,568,139 B2* | 7/2009 | Dokken et al. | 714/726 |
| 7,592,876 B2 | 9/2009 | Newman | |
| 7,617,470 B1 | 11/2009 | Dehon et al. | |
| 7,665,001 B2* | 2/2010 | Baik et al. | 714/726 |
| 7,793,119 B2 | 9/2010 | Gammie et al. | |
| 7,797,601 B2* | 9/2010 | Kapur et al. | 714/726 |
| 7,827,454 B2* | 11/2010 | Kurimoto | 714/731 |
| 7,911,221 B2 | 3/2011 | Yamaoka et al. | |
| 7,913,140 B2* | 3/2011 | Klein et al. | 714/732 |
| 8,099,271 B2 | 1/2012 | Schubert et al. | |
| 8,362,794 B2 | 1/2013 | Chen et al. | |
| 8,516,316 B2* | 8/2013 | Lam et al. | 714/726 |
| 8,612,815 B2* | 12/2013 | Pakbaz et al. | 714/733 |
| 2007/0143644 A1* | 6/2007 | Aldereguia et al. | 714/700 |
| 2008/0307277 A1 | 12/2008 | Tschanz et al. | |
| 2010/0095177 A1* | 4/2010 | Forlenza et al. | 714/731 |
| 2011/0006827 A1 | 1/2011 | Shimura | |
| 2013/0088256 A1 | 4/2013 | Chlipala et al. | |
| 2014/0149814 A1* | 5/2014 | Al-omari et al. | 714/727 |

OTHER PUBLICATIONS

Ghosh, S., et al., "A Novel Delay Fault Testing Methodology Using Low-Overhead Built-In Delay Sensor", IEEE Transactions on Computer-Aided Design of Integrated Circuits and Systems, vol. 25, Issue 12, Dec. 2006, pp. 2934-2943.

Datta, R., et al., "A Scheme for On-Chip Timing Characterization", Proceedings of the 24th IEEE VLSI Test Symposium, Apr. 30-May 4, 2006, 6 pages.

Wang, X., et al., "Path-RO: A Novel On-Chip Critical Path Delay Measurement Under Process Variations", IEEE/ACM International Conference on Computer-Aided Design, Nov. 10-13, 2008, pp. 640-646.

* cited by examiner

FUNCTIONAL PATH FAILURE MONITOR

BACKGROUND

1. Field

This disclosure relates generally to failure monitors for a functional path within an integrated circuit.

2. Related Art

A critical timing path of an integrated circuit (IC) refers to a path from an input to an output which has a maximum delay. Therefore, the critical paths of an IC determine the maximum speed at which the IC can operate. As a circuit ages, aging effects, including hot carrier injection (HCI), negative bias temperature instability (NBTI), IR-drop, affect the timing of functional paths, including these critical timing paths. These aging effects become even more pronounced as ICs continue decrease in size. These effects affect an IC's performance and can cause failure in timing of the critical paths of the IC. Therefore, it is necessary to monitor the effects of aging on functional paths, such as these critical timing paths.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In an integrated circuit, aging effects of a functional path can be monitored to determine when a failure has occurred or is about to occur. A functional path is a functional element of the integrated circuit which includes any number of flip-flops with circuitry in between the flip-flops. In one embodiment, portions of a functional path between an input and an output may be monitored for failure due, for example, to aging effects. For example, the input and output of a monitored portion, upon receiving a predetermined pattern, are compared to each other. This comparison is synchronized to a clock to generate pulses. These pulses are then counted to generate a signature which can be compared to an expected signature. The result of the signature comparison may be used to indicate whether a failure has occurred in the monitored portion. In one embodiment, a delay element can be utilized with the monitored portion such that the comparison of signatures may be used to indicate whether a failure of the monitored portion is imminent.

Figure 1:
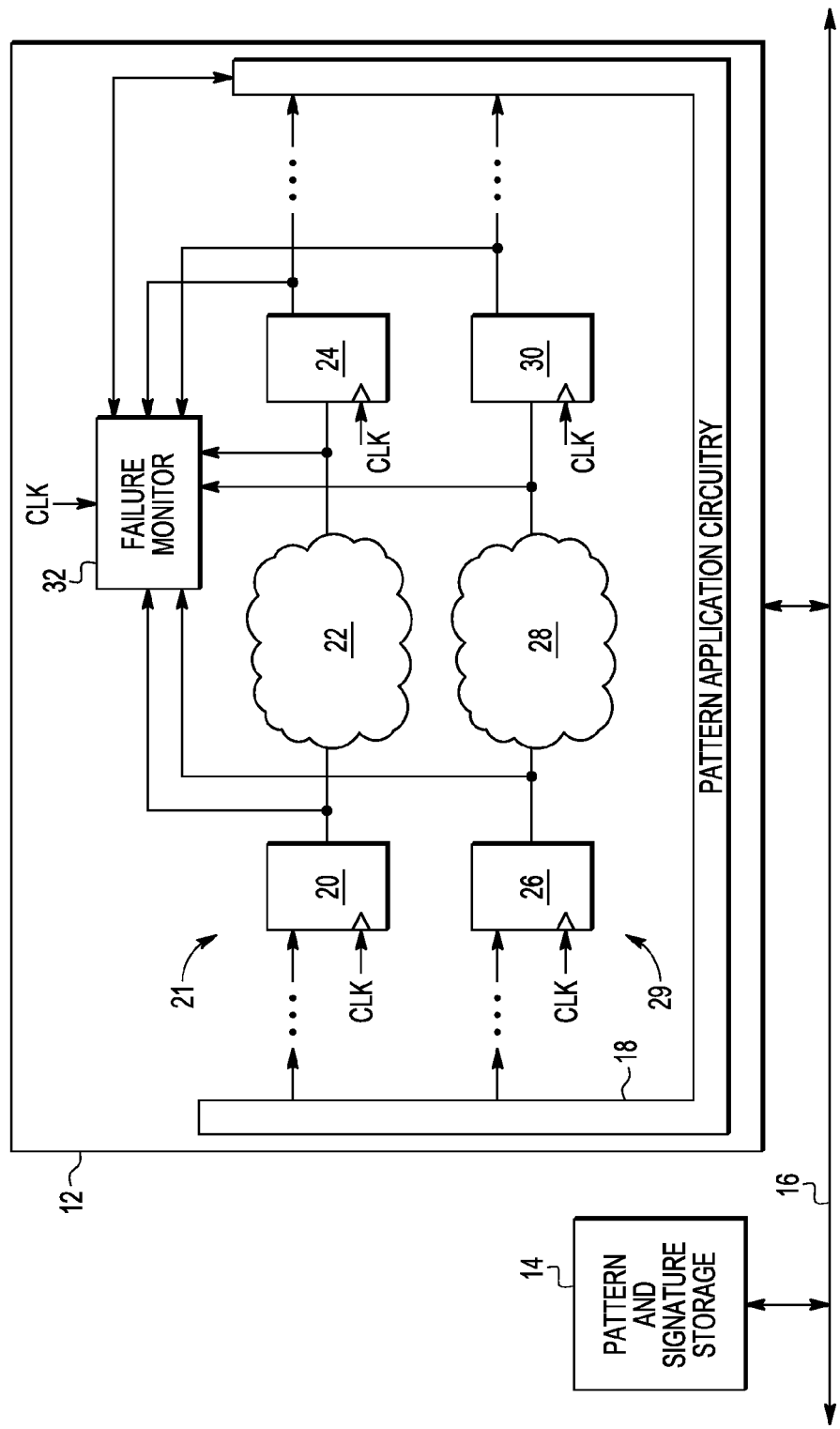
FIG. 1 illustrates, in block diagram form, a system in accordance with one embodiment of the present invention.

FIG. 1 illustrates, in block diagram form, a system 10 in accordance with one embodiment of the present invention. System 10 includes system circuitry 12 which can be any type of circuitry and perform any type of function. For example, in one embodiment, system circuitry 12 may be a processor or part of a processor. System 10 also includes pattern and signature storage circuitry 14 and a system interconnect 16, in which pattern and signature storage 14 and system circuitry 12 are coupled to system interconnect 16. Therefore, system circuitry 12 can communicate with pattern and signature storage 14 by way of system interconnect 16. System circuitry 12 includes a number of functional paths, such as functional paths 21 and 29. Each functional path may include any number of flip-flops with logic circuitry coupled between the flip-flops. For example, functional path 21 includes flip-flops 20 and 24 with logic circuitry 22 coupled between flip-flops 20 and 24. Flip-flop 20 receives a clock signal, CLK, and an input which may be provided by other logic circuitry of functional path 21 (not illustrated in FIG. 1) and provides an output to logic circuitry 22. Logic circuitry 22 may also receive inputs from other flip-flops (which may be in other functional paths) in addition to flip-flop 20. An output of logic circuitry 22 is provided to flip-flop 24. Note that flip-flop 24 may also provide its output to logic circuitry of other functional paths. Therefore, note that a functional path, such as functional path 21, may include a launch flip-flop, such as flip-flop 20, and a capture flip-flop, such as flip-flop 24. Each functional path includes circuitry, such as logic circuitry 22, between the launch and capture flip-flops. In the illustrated embodiment, logic circuitry 22 includes combinational logic; however, in alternate embodiments, additional clocked elements may be included between the launch and capture flip-flops. Note that analogous descriptions apply to functional path 29, flip-flops 26 and 30, and logic circuitry 28 as applied to functional path 21, flip-flops 20 and 24, and logic circuitry 22, respectively.

System circuitry 12 also includes pattern application circuitry 18. Each functional path has an input coupled to pattern application circuitry 18 and an output coupled to pattern application circuitry 18. For example, pattern application circuitry 18 may provide an input to a flip-flop whose output propagates through functional path 21 and provides an input to flip-flop 20. Similarly, pattern application circuitry 18 may provide an input to a flip-flop whose output propagates through functional path 29 and provides an input to flip-flop 26. The output of flip-flop 24 of functional path 21 may propagate through additional logic circuitry and flip-flops such that functional path 21 provides an output to pattern application circuitry 18. Similarly, the output of flip-flop 30 of functional path 29 may propagate through additional logic circuitry and flip-flops such that functional path 29 provides an output to pattern application circuitry 18. In this manner, pattern application circuitry 18 can provide a known pattern of inputs to the functional paths of system circuitry 12 and capture the propagated results at the outputs of the functional paths. Note that the values propagate through the flip-flops of the functional paths with each subsequent clock cycle of CLK.

System circuitry 12 also includes a failure monitor 32 which is coupled to the outputs of each of flip-flops 20, 24, 28, and 30 and the inputs of flip-flops 24 and 30, coupled to pattern application circuitry 18, and receives CLK as an input. Note that failure monitor 32 can also be coupled to the outputs of other flip-flops within the functional paths which are not illustrated in FIG. 1. Failure monitor 32, as will be described in further detail below, in reference to FIGS. 2 and 3, captures information about the functional paths and provides them to pattern application circuitry 18. Depending on the embodiment, failure monitor may not be coupled to all the inputs and outputs of the flip-flops as shown. For example, for the embodiment which will be described in reference to FIG. 2, failure monitor need not be coupled to the inputs of flip-flops 24 and 30, and for the embodiment which will be described in reference to FIG. 3, failure monitor 32 need not be coupled to the outputs of flip-flops 24 and 30. Note that at test time of system 10, known patterns can be provided by pattern application circuitry 18 to the functional paths of system circuitry 12. The outputs of failure monitor 32, and, optionally, the outputs of the functional paths, can be captured by pattern application circuitry 18. Therefore, for each input pattern, failure monitor 21 produces a particular result. This particular result corresponds to the expected result for each input pattern and is referred to as the expected signature. The expected signature may also be referred to as the valid signature which is the signature that is generated when the functional path is functioning properly. The pairings of the input pattern with the corresponding expected signature can be stored in pattern signature storage 14. As will be descried in more detail below, the stored patterns and signatures can be used by failure monitor 32 to provide a failure warning that a failure has occurred or that a failure is imminent (i.e. soon to occur).

Figure 2:
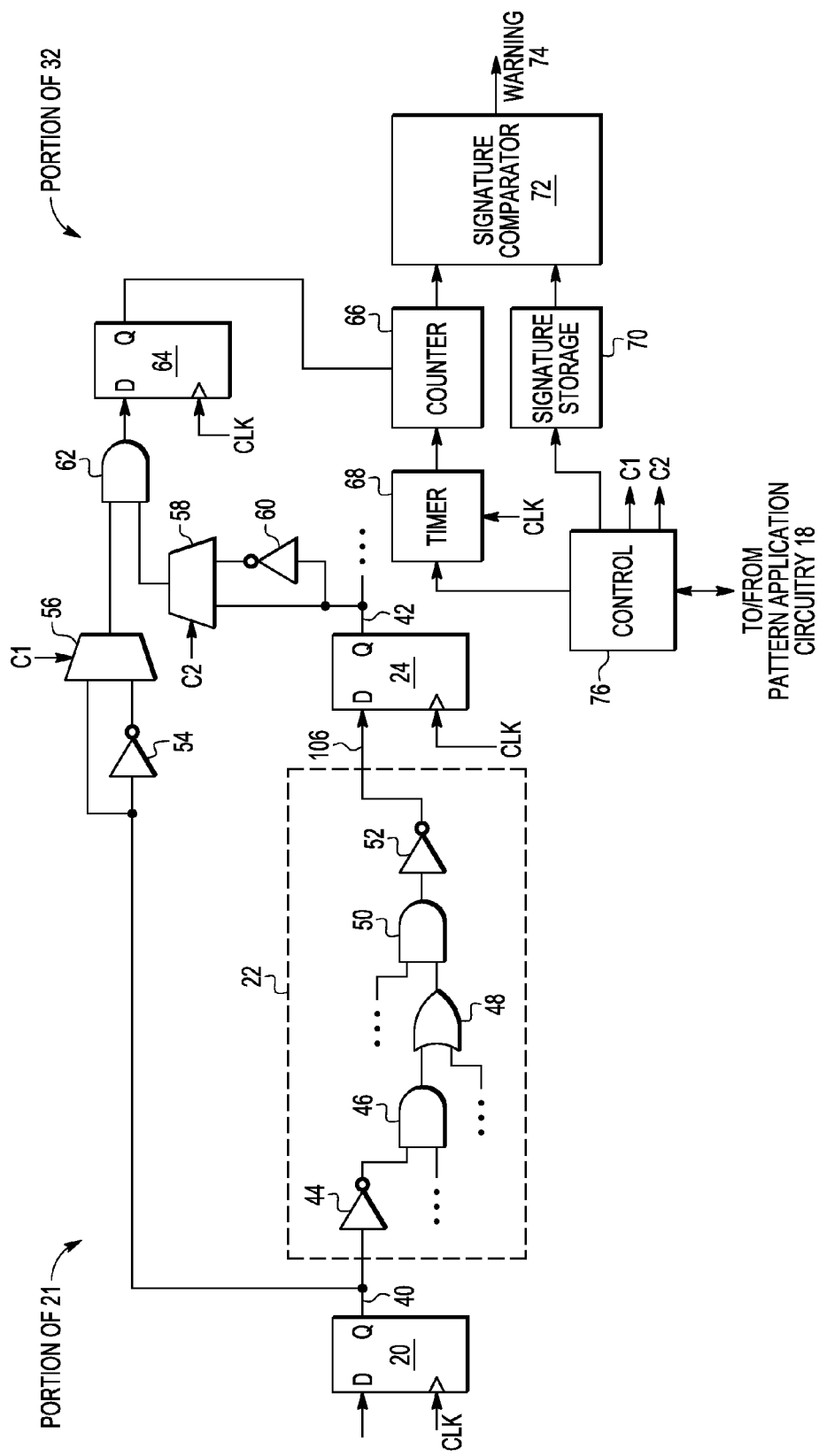
FIG. 2 illustrates, in block diagram form, a portion of the system of FIG. 1 in accordance with one embodiment of the present invention.

FIG. 2 illustrates, in block diagram form, a portion of functional path 21 and a portion of failure monitor 32 in accordance with one embodiment of the present invention. FIG. 2 includes flip-flops 20 and 24 of functional path 21 and logic circuitry 22 coupled between flip-flops 20 and 24. Flip-flops 20 and 24 are implemented as D flip flops. As an example, logic circuitry 22 includes inverters 44 and 52, AND gates 46 and 50, and OR gate 48. An output of flip-flop 20 is provided as an input to inverter 44, whose output is provided as an input to AND gate 36, whose output is provided as an input to OR gate 48, whose output is provided as an input to AND gate 50, whose output is provided to an input of inverter 52, and whose output is provided as an input to flip-flop 24. Therefore, a signal from the output of flip-flop 20 propagates through logic circuitry 22, by way of gates 44, 46, 48, 50, and 52, to flip-flop 24. Note that the configuration of logic gates of logic circuitry 22 is provided as an example only and any combinational logic may be included within logic circuitry 22. Furthermore, in alternate embodiments, additional clocked elements may also be included within logic circuitry 22.

FIG. 2 also illustrates a portion of failure monitor 32 which includes inverters 54 and 60, multiplexers (MUXes) 56 and 58, a D flip flop 64, a counter 66, a timer 68, control circuitry 76, signature storage 70, and a signature comparator 72. Circuit node 40 is at the input of logic circuitry 22 (at the output of flip-flop 20). Circuit node 106 is at the input of flip-flop 24, and circuit node 42 is at the output of flip-flop 24. In the illustrated embodiment, circuit node 42 is considered to be the output of logic circuitry 22 provided through flip-flop 24. In this example, flip-flop 24 may be considered as part of logic circuitry 22. In an alternate embodiment, as will be described in reference to FIG. 3, circuit node 106 at the input of flip-flop 24 is considered to be the output of logic circuitry 22.

Circuit node 40 is coupled to a first data input of MUX 56 and to an input of inverter 54. Circuit node 40 is also coupled to the input of inverter 44. MUX 56 has a second data input coupled to an output of inverter 54 and a control input coupled to receive control signal C1 which selects which of the first or second data inputs to provide as an output of MUX 56. Circuit node 42 at an output of flip-flop 24 is coupled to a first data input of MUX 58 and an input of inverter 60. MUX 58 has a second data input coupled to an output of inverter 60 and a control input coupled to receive control signal C2 which selects which of the first or second data inputs to provide as an output of MUX 58. AND gate 62 has a first input coupled to the output of MUX 56 and a second input coupled to the output of MUX 58. An output of AND gate 62 is coupled to an input of flip-flop 64. Flip-flop 64 also receives CLK and an output of flip-flop 64 is coupled to an input of counter 66. Counter 66 is also coupled to receive an output of timer 68. Timer 68 also receives CLK. Signature comparator 72 is coupled to counter 66 and signature storage 70 and provides warning 74. Control circuitry 76 is coupled to timer 68, signature storage 70, to pattern application circuitry 18, and provides C1 to the control input of MUX 56 and provides C2 to the control input of MUX 58.

In operation, MUX 56, MUX 58, AND gate 62, timer 68, and counter 66 generate a signature based on comparisons between the input to logic circuitry 22 (circuit node 40) and the output of logic circuitry 22 (circuit node 42 in the current example). Control circuitry 76 provides control value C1 so as to select one of the value at circuit node 40 (at the first data input of MUX 56) or the inverse of the value at circuit node 40 (corresponding to the output of inverter 54 at the second data input of MUX 56) to be provided as the first input to AND gate 62. Control circuitry 76 also provides control value C2 so as to select one of the value at circuit node 42 (at the first data input of MUX 58) or the inverse of the value at circuit node 42 (corresponding to the output of inverter 60 at the second data input of MUX 58) to be provided as the second input to AND gate 62. Therefore, AND gate 62 compares the value (or inverse of the value) at circuit node 40 to the value (or inverse of the value) at circuit node 42. Note that C1 and C2 can be independently set so as to select any combination of values or inverse values at nodes 40 and 42 for comparison by AND gate 62. When the first and second input values of AND gate 62 match, the output of AND gate 62 is a logic level one, and when they do not match, the output is a logic level low. The output of AND gate 62 is sampled by flip-flop 64 in accordance with CLK. That is, with every rising edge of CLK, the output of flip-flop 64 provides the value at the output of AND gate 62. In this manner, the output of AND gate 62 is synchronized to CLK. If, for example, at a rising edge of CLK, the input to flip-flop 64 is a logic level one, then a logic level one is provided at the output of flip-flop 64 for the duration of the clock cycle.

Therefore, the output of flip-flop 64 provides a pulse, i.e. a rising edge, each time the inputs of AND gate 62 match at the rising edge of CLK. These pulses are counted by counter 66. Counter 66 is enabled by timer 68 such that timer 68 can provide a window of time over which counter 66 is enabled to count the pulses at the output of flip-flop 64. At the expiration of timer 68, the count value of counter 66 is provided as the generated signature to signature comparator 72 for comparison with the expected signature. In one embodiment, upon enabling of timer 68, counter 66 increments from zero with each pulse at the output of flip-flop 64. However, alternatively, counter 66 may decrement from a predetermined value with each pulse of flip-flop 64. Therefore, note that the signature generated by counter 66 is used to monitor a portion of functional path 22 between nodes 40 and 42.

As described above, at test time of system circuitry 12, simulations or measurements may be performed with a set of test inputs provided by pattern application circuitry 18 to the functional paths, such as to function path 21. Note that failure monitor 32 may include any number of counters, such as counter 66, which provide a count of pulses at an output of a flip-flop, such as flip-flop 64, based on comparisons between input and output circuit nodes of logic circuitry within the functional paths of system circuitry 12. With each set of test inputs to the functional paths, each counter, such as counter 66, provides a signature corresponding to the test input for the monitored portion of the functional path. For example, with a set of test inputs to the functional paths, counter 66 counts the pulses at the output of flip-flop 64 over the timing window provided by timer 68 to provide a count value as the expected signature for that test input for the portion of functional path 21 between nodes 40 and 42. The expected signature corresponds to the signature generated when the functional paths are functioning properly. The set of test inputs used for the functional paths and the corresponding count values (signatures) of each counter such as counter 66 of failure monitor 32 can be stored in pattern and signature storage 14.

During operation of system circuitry 12, during which the failure of the functional paths are being monitored, pattern application circuitry 18 can retrieve a test pattern (a set of inputs for the functional paths of system circuitry 12) from pattern and signature storage 14. Also, pattern application circuitry 18, upon retrieving the test pattern, can also retrieve the corresponding expected signature (i.e. valid signature) and provide it to control 76 which can then store the value to signature storage 70. In this manner, during operation, signature comparator 72 can compare the output of counter 66 (the generated signature over the window determined by timer 68) to the expected signature in signature storage 70 and provide a warning 74 accordingly. If the generated signature matches the expected signature, then warning 74 remains negated. However, if the generated signature does not match the expected signature, then warning 74 is asserted indicating a failure in functional path 21. For example, portions of logic circuitry 22, due to aging, may not propagate the signals at the expected speed and thus the comparisons between nodes 40 and 42 which result in the pulses at the output of flip-flop 64 may no longer be the same as expected, thus indicating a failure within logic circuitry 22.

Therefore, note that failure monitor circuitry, such as MUXes 56 and 58, along with AND gate 62, flip-flop 64, timer 68, and counter 66 can be used to monitor a portion of a functional path for failure, such as due to aging effects. Therefore, failure monitor 32 can include these elements, along with the signature storage and signature comparator, for each portion of a functional path to be monitored to generate a warning indicator, such as warning 74, to indicate when that portion of the functional path has failed. For example, the circuitry of failure monitor 32 illustrated in FIG. 2 monitors a portion of functional path 21 between nodes 40 and 42.

Figure 3:
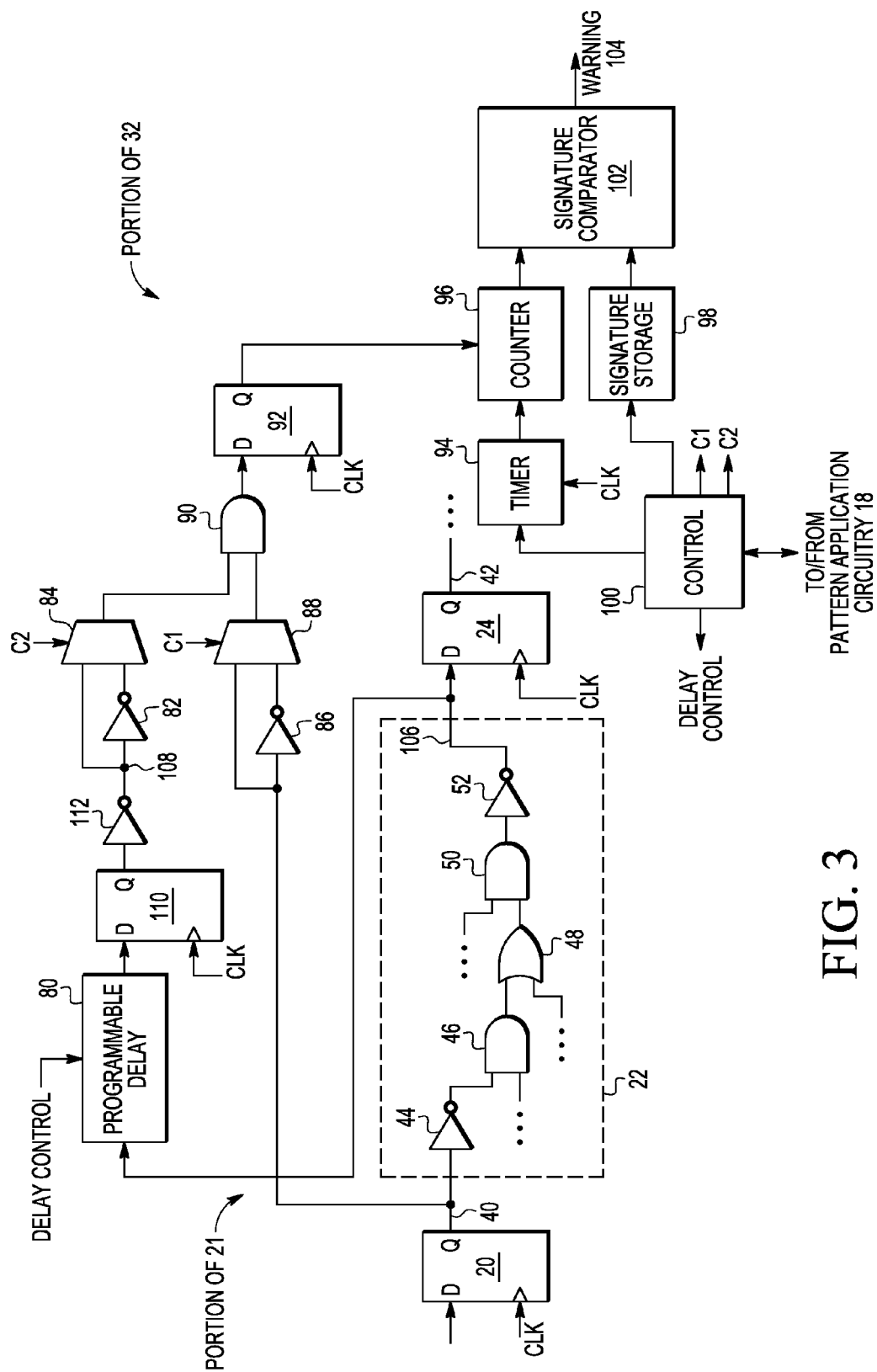
FIG. 3 illustrates, in block diagram form, a portion of the system of FIG. 1 in accordance with another embodiment of the present invention.

In one embodiment, a warning indicator can be provided when failure of a functional path is imminent rather than when failure has already occurred. In one embodiment, this is achieved by a programmable delay element introduced into the circuitry of failure monitor 32 which provides a delay in the generation of the signature but does not affect the timing of the functional path during normal operation. FIG. 3 illustrates, in block diagram form, a portion of functional path 21 and a portion of failure monitor 32 in accordance with another embodiment of the present invention. Note that like numerals with FIG. 2 indicate like elements.

Note that the description and connectivity of inverter 82, MUX 84, inverter 86, MUX 88, AND gate 90, flip-flop 92 (implemented as a D flip-flop), counter 96, timer 94, control 100, signature storage 98, and signature comparator 102 are analogous to the description and connectivity of inverter 60, MUX 58, inverter 54, MUX 56, AND gate 62, flip-flop 64, counter 66, timer 68, control 76, signature storage 70, and signature comparator 72. However, failure monitor circuit 32 of FIG. 3 includes a programmable delay element 80 having an input coupled to node 106, and an output coupled to a data input of a flip-flop 110 (implemented as a D flip-flop). An output of flip-flop 110 is coupled to an input of an inverter 112, whose output is coupled to a circuit node 108, which is coupled to a first data input of MUX 84 and an input of inverter 82. Flip-flop 110 also receives CLK at its clock input. Therefore, note that, while a first input of AND gate 90 (the bottom input) is coupled to receive either the value at node 40 or the inverse of the value at node 40, based on the value of C1, in a manner similar to the first input of AND gate 62 (the top input) of FIG. 2, the second input of AND gate 90 (the top input) is coupled to receive either a delayed value at node 106 or the inverse of the delayed value at node 106, based on the value of C2. That is, note that the value at node 106 is provided by way of programmable delay element 80 to flip-flop 110 which stores the value at node 106 in accordance with CLK similar to how flip-flop 24 did so in the embodiment of FIG. 2. Therefore, in FIG. 2, failure monitor 32 monitors the output of flip-flop 24 by monitoring circuit node 42, and in FIG. 3, failure monitor 32 monitors a delayed version of the input to flip-flop 24 (at node 106) by monitoring the output of flip-flop 110. Note that, in the embodiment of FIG. 3, the first data input to MUX 84 receives the inverse of the delayed value at node 106 while the second data input to MUX 84 receives the delayed value at node 106, in which C2 can be set accordingly to select the delayed value or the inverse of the delayed value. In this manner, AND gate 90 compares the value at node 40 (or the inverse of the value at node 40) with a delayed value at node 106 (or the inverse of the value at node 106) and provides this comparison result to the input of flip-flop 92. In a manner similar to flip-flop 64, flip-flop 92 generates pulses in accordance with CLK based on the output of AND gate 90. Counter 96 counts the pulses generated by flip-flop 92 to generate a signature corresponding to the monitored portion between circuit node 40 and circuit node 108.

As described above, during testing of system 12, pairings of test inputs and corresponding expected signatures can be generated and stored within pattern and signature storage 14, as was described above. During operation, if the generated signature provided by counter 96 is determined by signature comparator 102 to not match the expected signature (which may be stored in signature storage 98), warning 104 is asserted to indicate that a failure in logic circuitry 22 is imminent. That is, if the timing of logic circuitry 22 continues to change, such as due to aging effects, by an amount equal to the amount of delay introduced by the programmable delay, failure will occur. Therefore, note that control 100 may provide a delay control to programmable delay 80 which allows the amount of delay introduced by programmable delay 80 to be programmable. The shorter the amount of delay, the sooner after assertion of warning 104 an actual failure will occur.

Note that programmable delay element 80 allows for the assertion of warning 104 (which indicates failure is imminent) prior to the assertion of warning 74 (which indicates actual failure). However, note that during normal circuit operation, functional path 21 is not affected by programmable delay element 80. That is, the output of inverter 52 is still provided directly to the input of flip-flop 24. Therefore, the programmable delay element only affects failure and monitor circuit 32 and does not affect the timing of the functional path during normal operation of system circuitry 12. Programmable delay element 80 may be implemented in a variety of different ways using known circuit techniques. For example, programmable delay element 80 may include a number of series-connected length-selectable inverter chains which may be used to add the desired delay.

In one embodiment, a failure monitor may be used to monitor multiple serially connected paths. In this embodiment, an input from each connected path, as well as an output of the multiple serially connected paths can be provided to a multiple-input AND gate which would be coupled in a manner similar to AND gate 62 or 90. That is, the output of the multiple-input AND gate would be provided to a flip-flop, similar to flip-flop 64 or 92, to provide pulses to the counter. In this embodiment, additional circuitry, such as inverters and MUXes, can be used to provide either the values or the complements of the values from the connected paths to the multiple-input AND gate.

In yet another embodiment, a failure monitor may be used to monitor multiple parallel paths. In this embodiment, the inputs from the paths may be provided to a MUX and the outputs from the paths may be provided to another MUX, in which the MUXes can provide a selected input and a selected output of one of the multiple parallel paths to an AND gate, such as AND gate 62 or 90.

Note that in the embodiments described above, each of AND gates 62 and 90 may be referred to as a logic comparator, which compares the input and the output of a monitored functional path. However, in alternate embodiments, the logic comparator may be implemented using different or additional logic gates whose output can be provided to a flip-flop, such as flip-flop 64 or 92, to generate the pulses.

Therefore, by now it has been appreciated how failure monitor circuitry may be used to provide a failure warning for a monitored portion of a functional path to indicate a failure has occurred or that a failure is imminent. Pulses are generated with respect to a clock signal, such as CLK, based on comparisons between an input and output of the monitored portion. For example, the outputs of AND gates 62 and 90 are captured by flip-flops 64 and 92, respectively, in accordance with CLK in order to generate the pulses. In this manner, glitches in logic circuitry 22 may not result in false alarms. Also, note that failure monitor circuitry 32 is not affected by IR-drops, aging, or flip-flop metastabilities. Furthermore, inclusion of delay element 80 allows for a warning indictor with an adaptive margin without affecting the topology of the functional paths.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

In one embodiment, the illustrated elements of system 10 are circuitry located on a single integrated circuit or within a same device. Alternatively, system 10 may include any number of separate integrated circuits or separate devices interconnected with each other. For example, system circuitry 12 may be located on a same integrated circuit as pattern and signature storage 14.

Although the invention is described herein with reference to specific embodiments, various modifications and changes can be made without departing from the scope of the present invention as set forth in the claims below. For example, different circuitry (e.g. in place of the AND gate) may be used to perform the comparisons between the input and output of the monitored functional path. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

One embodiment of the present invention provides for system circuitry which includes a logic circuit having an input and an output that is a functional element of the system circuitry; pattern application circuitry coupled to the input of the logic circuit that provides an input pattern to the input of the logic circuit, wherein the input pattern has a valid signature based upon a comparison of the input and the output of the logic circuit when the logic circuit is functioning properly; a logic comparator coupled to the input and the output of the logic circuit that generates pulses in response to the input pattern; a counter coupled to the logic comparator that obtains a count of the pulses generated by the logic comparator in response to the input pattern; and a signature comparator coupled to the counter that generates a warning signal if the valid signature is different from the count.

In one aspect of the above embodiment, the system circuitry further includes a delay circuit between the output of the logic circuit and the logic comparator, wherein the warning signal indicates an imminent failure of the logic circuit. In a further aspect, the logic circuit comprises a plurality of logic gates having an output coupled to the delay circuit. In yet a further aspect, the system circuitry further comprises a flip-flop having an input coupled to the output of the plurality of logic gates and an output for use by the system circuitry. In yet a further aspect, a delay of the delay circuit is programmable.

In another aspect of the above embodiment, the system circuitry further includes a timer coupled to the counter to indicate a start and stop of the counter in order to obtain the count.

In yet another aspect of the above embodiment, the logic circuit comprises a plurality of logic gates and a flip-flop, wherein an output of the flip-flop is the output of the logic circuit and the warning signal indicates an actual failure of the logic circuit.

In yet another aspect of the above embodiment, the logic comparator includes an AND circuit and a first flip-flop having an output coupled to the counter, and a second flip-flop coupled to the input of the logic circuit, wherein the first and second flip-flops are clocked by a clock signal. In a further aspect, the logic circuit comprises a plurality of logic gates and a third flip-flop having an output, wherein the output of the third flip-flop is the output of the logic circuit and the third flip-flop is clocked by the clock signal. In another further aspect, the logic circuit comprises a plurality of logic gates having an output as the output of the logic circuit and the system circuitry further comprises a third flip-flop coupled to the output of the logic gates, wherein the third flip-flop is clocked by the clock signal.

Another embodiment of the present invention provides for a method of operating system circuitry, wherein the method includes using a logic circuit having an input and an output as a functional element of the system circuitry; providing an input pattern to the input of the logic circuit, wherein the input pattern has a valid signature based upon a comparison of the input and the output of the logic circuit when the logic circuit is functioning properly; generating pulses in response to the input and the output of the logic circuit when the logic circuit receives the input pattern; and counting the pulses generated in response to the input pattern to provide a count; and generating a warning signal if the valid signature is different from the count.

In one aspect of the above embodiment, the generating the pulses is further characterized by adding delay to the output of the logic circuit, wherein the warning signal indicates an imminent failure of the logic circuit. In a further aspect, the using the logic circuit is further characterized by the logic circuit comprising a plurality of logic gates having an output as the output of the logic circuit and the adding delay is further characterized by adding delay to the output of the logic gates. In yet a further aspect, the method includes using a flip-flop having an input coupled to the output of the plurality of logic gates and an output. In yet a further aspect, adding delay is further characterized by the delay being programmable.

In another aspect of the above embodiment, the using the logic circuit is further characterized by the logic circuit further comprising a plurality of logic gates and a flip-flop, wherein an output of the flip-flop is the output of the logic circuit.

In yet another aspect of the above embodiment, the providing an input pattern to the input of the logic circuit uses a first flip-flop clocked by a clock signal; and the generating pulses uses a second flip-flop clocked by the clock signal. In a further aspect, the using the logic circuit is further characterized by the logic circuit comprising a plurality of logic gates and a third flip-flop having an output, wherein the output of the third flip-flop is the output of the logic circuit and the third flip-flop is clocked by the clock signal. In another further aspect, the using the logic circuit is further characterized by the logic circuit comprising a plurality of logic gates having an output as the output of the logic circuit and the system circuitry further comprises a third flip-flop coupled to the output of the logic gates, wherein the third flip-flop is clocked by the clock signal.

Yet another embodiment of the present invention provides for system circuitry which includes a logic circuit having a critical path between an input and an output; pattern application circuitry coupled to the input of the logic circuit that provides an input pattern to the input of the logic circuit, wherein the input pattern has a valid signature based upon a comparison of the input and the output of the logic circuit when the logic circuit is functioning properly; a logic comparator coupled to the critical path that generates pulses in response to the logic circuit receiving the input pattern; a counter coupled to the logic comparator that obtains a count of the pulses generated by the logic comparator in response to the logic circuit receiving the input pattern; and a signature comparator coupled to the counter that generates a warning signal if the valid signature is different from the count, wherein the warning signal indicates one of group consisting of an imminent failure and an actual failure.

What is claimed is:

1. System circuitry, comprising:
   a logic circuit having an input and an output that is a functional element of the system circuitry;
   pattern application circuitry coupled to the input of the logic circuit that provides an input pattern to the input of the logic circuit, wherein the input pattern has a valid signature based upon a comparison of the input and the output of the logic circuit when the logic circuit is functioning properly;
   a logic comparator coupled to the input and the output of the logic circuit that generates pulses in response to the input pattern;
   a counter coupled to the logic comparator that obtains a count of the pulses generated by the logic comparator in response to the input pattern; and
   a signature comparator coupled to the counter that generates a warning signal if the valid signature is different from the count.

2. The system circuitry of claim 1, further comprising a delay circuit between the output of the logic circuit and the logic comparator, wherein the warning signal indicates an imminent failure of the logic circuit.

3. The system circuitry of claim 2, wherein the logic circuit comprises a plurality of logic gates having an output coupled to the delay circuit.

4. The system circuitry of claim 3, wherein the system circuitry further comprises a flip-flop having an input coupled to the output of the plurality of logic gates and an output for use by the system circuitry.

5. The system circuitry of claim 4, wherein a delay of the delay circuit is programmable.

6. The system circuitry of claim 1, further comprising a timer coupled to the counter to indicate a start and stop of the counter in order to obtain the count.

7. The system circuitry of claim 1, wherein the logic circuit comprises a plurality of logic gates and a flip-flop, wherein an output of the flip-flop is the output of the logic circuit and the warning signal indicates an actual failure of the logic circuit.

8. The system circuitry of claim 1, wherein the logic comparator comprises:
an AND circuit and a first flip-flop having an output coupled to the counter; and
a second flip-flop coupled to the input of the logic circuit;
wherein the first and second flip-flops are clocked by a clock signal.

9. The system circuitry of claim 8, wherein the logic circuit comprises a plurality of logic gates and a third flip-flop having an output, wherein the output of the third flip-flop is the output of the logic circuit and the third flip-flop is clocked by the clock signal.

10. The system circuitry of claim 8, wherein the logic circuit comprises a plurality of logic gates having an output as the output of the logic circuit and the system circuitry further comprises a third flip-flop coupled to the output of the logic gates, wherein the third flip-flop is clocked by the clock signal.

11. A method of operating system circuitry, comprising:
using a logic circuit having an input and an output as a functional element of the system circuitry;
providing an input pattern to the input of the logic circuit, wherein the input pattern has a valid signature based upon a comparison of the input and the output of the logic circuit when the logic circuit is functioning properly;
generating pulses in response to the input and the output of the logic circuit when the logic circuit receives the input pattern; and
counting the pulses generated in response to the input pattern to provide a count; and
generating a warning signal if the valid signature is different from the count.

12. The method of claim 11, wherein the generating the pulses is further characterized by adding delay to the output of the logic circuit, wherein the warning signal indicates an imminent failure of the logic circuit.

13. The system circuitry of claim 12, wherein the using the logic circuit is further characterized by the logic circuit comprising a plurality of logic gates having an output as the output of the logic circuit and the adding delay is further characterized by adding delay to the output of the logic gates.

14. The method of claim 13, further comprising using a flip-flop having an input coupled to the output of the plurality of logic gates and an output.

15. The method of claim 14, wherein the adding delay is further characterized by the delay being programmable.

16. The method of claim 11, wherein the using the logic circuit is further characterized by the logic circuit further comprising a plurality of logic gates and a flip-flop, wherein an output of the flip-flop is the output of the logic circuit.

17. The method of claim 11, wherein:
the providing an input pattern to the input of the logic circuit uses a first flip-flop clocked by a clock signal; and
the generating pulses uses a second flip-flop clocked by the clock signal.

18. The system circuitry of claim 17, wherein the using the logic circuit is further characterized by the logic circuit comprising a plurality of logic gates and a third flip-flop having an output, wherein the output of the third flip-flop is the output of the logic circuit and the third flip-flop is clocked by the clock signal.

19. The system circuitry of claim 17, wherein the using the logic circuit is further characterized by the logic circuit comprising a plurality of logic gates having an output as the output of the logic circuit and the system circuitry further comprises a third flip-flop coupled to the output of the logic gates, wherein the third flip-flop is clocked by the clock signal.

20. System circuitry, comprising:
a logic circuit having a critical path between an input and an output;
pattern application circuitry coupled to the input of the logic circuit that provides an input pattern to the input of the logic circuit, wherein the input pattern has a valid signature based upon a comparison of the input and the output of the logic circuit when the logic circuit is functioning properly;
a logic comparator coupled to the critical path that generates pulses in response to the logic circuit receiving the input pattern;
a counter coupled to the logic comparator that obtains a count of the pulses generated by the logic comparator in response to the logic circuit receiving the input pattern; and
a signature comparator coupled to the counter that generates a warning signal if the valid signature is different from the count, wherein the warning signal indicates one of group consisting of an imminent failure and an actual failure.

* * * * *